(12) United States Patent
Luo et al.

(10) Patent No.: US 10,852,604 B2
(45) Date of Patent: Dec. 1, 2020

(54) ARRAY SUBSTRATE AND DISPLAY PANEL

(71) Applicant: XIAMEN TIANMA MICRO-ELECTRONICS, CO., LTD., Xiamen (CN)

(72) Inventors: Xiaodong Luo, Xiamen (CN); Poping Shen, Xiamen (CN); Xiufeng Zhou, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 6 days.

(21) Appl. No.: 16/169,823

(22) Filed: Oct. 24, 2018

(65) Prior Publication Data

US 2019/0121211 A1   Apr. 25, 2019

(30) Foreign Application Priority Data

Oct. 25, 2017   (CN) .......................... 2017 1 1007617

(51) Int. Cl.
*G02F 1/1362* (2006.01)
*G09G 3/3208* (2016.01)
*H01L 27/32* (2006.01)
*G02F 1/1333* (2006.01)

(52) U.S. Cl.
CPC ...... *G02F 1/136286* (2013.01); *G02F 1/1333* (2013.01); *G09G 3/3208* (2013.01); *H01L 27/3244* (2013.01); *H01L 27/3276* (2013.01)

(58) Field of Classification Search
CPC ............. G02F 1/136286; G02F 1/1333; G02F 2201/56; H01L 27/3276; H01L 27/3244; H01L 27/3279; G09G 3/3208
See application file for complete search history.

(56) References Cited

U.S. PATENT DOCUMENTS

| | | | |
|---|---|---|---|
| 2006/0164352 A1* | 7/2006 | Yoo ................... | G02F 1/134309 345/87 |
| 2012/0062528 A1* | 3/2012 | Kimura ................ | G09G 3/3648 345/204 |
| 2013/0278553 A1* | 10/2013 | Suzuki .............. | G02F 1/133528 345/174 |
| 2015/0129985 A1* | 5/2015 | Kim .................. | G02F 1/136286 257/401 |
| 2015/0318305 A1* | 11/2015 | Zhang ................. | H01L 27/1259 257/773 |

(Continued)

*Primary Examiner* — Jose R Soto Lopez
(74) *Attorney, Agent, or Firm* — Alston & Bird LLP

(57) ABSTRACT

An array substrate includes: a display region, a non-display region surrounding the display region, at least one notch in the non-display region, and multiple gate lines. The gate lines include regular gate lines and irregular gate lines. The regular gate line is located in the display region and extends in a first direction. The irregular gate line includes a regular section located in the display region and extends in the first direction and an irregular section located in the non-display region around the notch. The regular section and the irregular section of the same irregular gate line are electrically connected. The irregular section includes a first sub-section and/or a second sub-section. The first sub-section and the second sub-section of the same irregular section are electrically connected to each other. A resistivity of the first sub-section is greater than a resistivity of the second sub-section.

12 Claims, 11 Drawing Sheets

(56) References Cited

U.S. PATENT DOCUMENTS

| | | | | |
|---|---|---|---|---|
| 2016/0063912 A1* | 3/2016 | Zhang | ............ | H01L 27/124 |
| | | | | 345/212 |
| 2016/0111040 A1* | 4/2016 | Kim | ............ | G02F 1/13454 |
| | | | | 345/698 |
| 2016/0291376 A1* | 10/2016 | Iwatsu | ............ | G02F 1/133512 |
| 2016/0342057 A1* | 11/2016 | Zhang | ............ | G02F 1/133528 |
| 2017/0167924 A1* | 6/2017 | Cheng | ............ | G01K 7/028 |
| 2017/0192327 A1* | 7/2017 | Fu | ............ | G02F 1/1362 |
| 2017/0227804 A1* | 8/2017 | Nagasawa | ............ | G02F 1/1339 |
| 2017/0249906 A1* | 8/2017 | Noh | ............ | G09G 3/3266 |
| 2018/0033833 A1* | 2/2018 | An | ............ | G06F 3/0446 |
| 2018/0067357 A1* | 3/2018 | Katsuta | ............ | H01L 27/3297 |
| 2018/0158421 A1* | 6/2018 | Kadowaki | ............ | G05B 19/418 |
| 2019/0005915 A1* | 1/2019 | Liu | ............ | G02F 1/13454 |
| 2019/0033638 A1* | 1/2019 | Nakanishi | ............ | G02F 1/133514 |
| 2019/0051710 A1* | 2/2019 | Hsu | ............ | H01L 51/5228 |
| 2019/0235307 A1* | 8/2019 | Wang | ............ | H01L 27/1248 |
| 2019/0331974 A1* | 10/2019 | Furuta | ............ | G09G 3/20 |
| 2019/0361303 A1* | 11/2019 | Wang | ............ | G02F 1/136204 |

\* cited by examiner

ARRAY SUBSTRATE AND DISPLAY PANEL

CROSS REFERENCE OF RELATED APPLICATION

The present application claims the priority to Chinese Patent Application No. CN 201711007617.6, titled "ARRAY SUBSTRATE AND DISPLAY PANEL", filed on Oct. 25, 2017 with the State Intellectual Property Office of the PRC, which is incorporated herein by reference in its entirety.

FIELD

The present disclosure relates to the field of display technology, and in particular to an irregularly shaped display panel.

BACKGROUND

With continuous development of the display technology, requirements on display functions of a display panel are increasingly more strict. In order to better adapt to an overall structure and use requirements of the environment, requirements on a shape of the display panel are gradually increased. Hence, an irregularly shaped display panel appears accordingly, which has good application prospects.

The existing most commonly used irregularly shaped display panel is an irregularly shaped display panel with a notch. Due to the notch, a part of the gate lines are divided into two parts, resulting in that a part of the gate lines near the notch cannot be driven, thereby affecting a display effect of the display panel.

In order to solve the above problem, in the conventional technology, the gate lines located on both sides of the notch and at the same row are connected through wiring around the notch. In this case, although the gate lines around the notch can be driven, the resistance of the gate lines around the notch is increased since the lengths of the gate lines around the notch are increased due to the wiring around the notch, which affects the display effect of the display panel.

Hence, in view of the above problem, an urgent solution is needed.

SUMMARY

In order to solve the problem described in the background, an array substrate and a display panel are provided according to the present disclosure, which can ensure that resistances of gate lines around the notch are substantially the same, and improve a display effect of the display panel.

In order to solve the above technical problem, an array substrate is provided in the present disclosure. The array substrate includes: a display region; a non-display region surrounding the display region; at least one notch in the non-display region and multiple gate lines.

The multiple gate lines include regular gate lines and irregular gate lines. Each of the regular gate lines is located in the display region and extends in a first direction. The irregular gate line includes a regular section located in the display region and extends in the first direction and an irregular section located in the non-display region around the notch. The regular section and the irregular section of the same irregular gate line are electrically connected to each other.

The irregular section includes at least one of a first sub-section and a second sub-section. The first sub-section and the second sub-section of the same irregular section are electrically connected to each other. A resistivity of the first sub-section is greater than a resistivity of the second sub-section.

In order to solve the above technical problem, a display panel is further provided according to the present disclosure, which includes the above array substrate.

Compared with the conventional technology, the array substrate and the display panel according to the present disclosure achieve the following beneficial effects.

An array substrate and a display panel are provided according to the present disclosure. The regular sections located on both sides of the notch are connected via the irregular section to form the irregular gate lines, such that the gate lines near the notch can be driven. In addition, the irregular sections include the first sub-section and the second sub-section, and the resistivity of the first sub-section is greater than the resistivity of the second sub-section. In this way, it is ensured that the resistance of the irregular gate lines is substantially the same as the resistance of the regular gate lines, thereby improving the display effect of the display panel.

Other features and advantages of the present disclosure will become clear through the detailed description of the exemplary embodiment of the present disclosure in conjunction with the drawings hereinafter.

BRIEF DESCRIPTION OF THE DRAWINGS

The drawings, which are combined in the specification and form a part of the specification, show the embodiments of the present disclosure and are used for explaining the principle of the present disclosure together with the description of the drawings.

DETAILED DESCRIPTION

Figure 1:
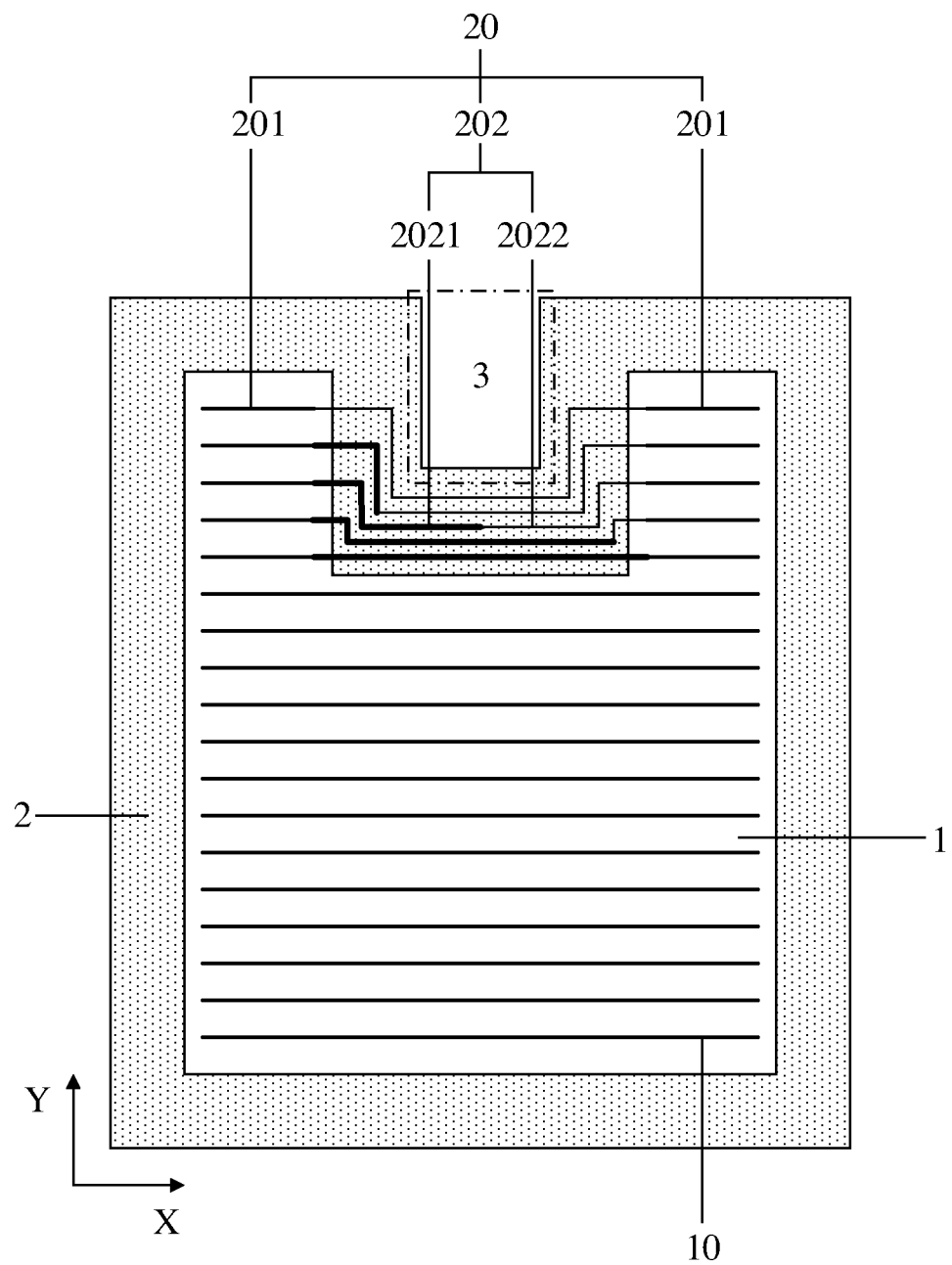
FIG. 1 is a schematic structural diagram of an array substrate according to the present disclosure.

Various exemplary embodiments of the present disclosure are described in detail with reference to the drawings. It should be noted that relative arrangement of components and steps, numerical expressions and values clarified in the embodiments are not intended to limit the scope of the present disclosure, unless otherwise specified.

The following description of the at least one exemplary embodiment is merely illustrative and shall not be constructed as any limitation on the disclosure and its application or use.

Techniques, methods and apparatus known to those skilled in the art may not be discussed in detail here, and the techniques, methods and apparatus should be considered as a part of the specification where appropriate.

In all of the examples shown and discussed herein, any specific values are to be construed as illustrative only rather than limitation. Thus, different values may be used in other examples of the exemplary embodiments.

It should be noted that similar reference numerals and letters indicate similar items in the following drawings. Therefore, once an item is defined in one drawing, the item is not required to be further discussed in subsequent drawings.

In order to solve a problem according to the conventional technology that a resistance is increased due to long gate lines around the notch, thereby affecting the display effect of the display panel, an array substrate is provided according to an embodiment. The array substrate is described in detail in conjunction with the drawings below.

FIG. 1 is a schematic structural diagram of an array substrate according to the present disclosure. As shown in FIG. 1, the array substrate includes a display region 1 and a non-display region 2 surrounding the display region 1. The array substrate includes at least one notch 3 in the non-display region.

The array substrate includes multiple gate lines. The gate lines include regular gate lines 10 and irregular gate lines 20. Each of the regular gate lines 10 is located in the display region 1 and extends in a first direction X. The irregular gate line 20 include a regular section 201 located in the display region and extends in the first direction and an irregular section 202 located in the non-display region 2 around the notch 3. The regular section 201 and the irregular section 202 of the same irregular gate line 20 are electrically connected to each other.

The irregular section 202 includes a first sub-section 2021 and/or a second sub-section 2022. As shown in FIG. 1, the irregular section 202 may include only the first sub-section 2021 or the second sub-section 2022. Alternatively, the irregular section 202 may include both the first sub-section 2021 and the second sub-section 2022. The first sub-section 2021 and the second sub-section 2022 of the same irregular section 202 are electrically connected to each other. A resistivity of the first sub-section 2021 is greater than a resistivity of the second sub-section 2022.

With the array substrate provided according to the embodiment, the regular sections located on both sides of the notch are connected via the irregular sections to form the irregular gate lines, such that the gate lines near the notch can be driven. In addition, the irregular section includes the first sub-section and the second sub-section, and the resistivity of the first sub-section is greater than the resistivity of the second sub-section. In this way, it is ensured that the resistance of the irregular gate lines is substantially the same as the resistance of the regular gate lines, thereby improving the display effect of the display panel.

Figure 2:
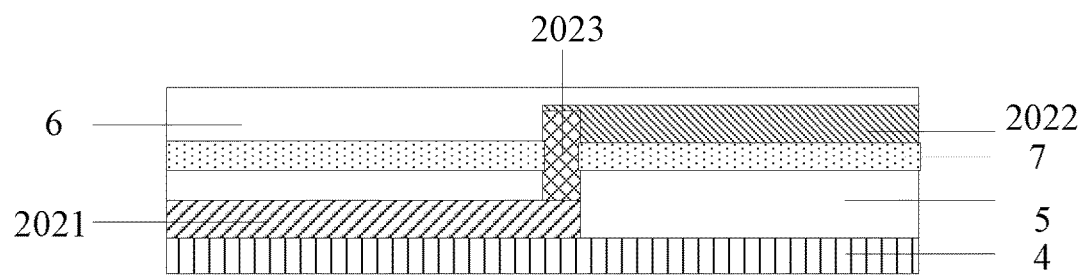
FIG. 2 is a schematic cross sectional diagram of an array substrate according to the present disclosure.

FIG. 2 is a schematic cross sectional diagram of an array substrate according to the present disclosure. As shown in FIG. 2, the array substrate includes a substrate layer 4, a first metal layer 5 and a second metal layer 6. The first metal layer 5 is located at a side of the substrate layer 4, and the second metal layer 6 is located at a side of the first metal layer 5 facing away from the substrate layer 4. In some optional embodiments, the regular gate lines 10 (not shown in FIG. 2), the regular sections 201 (not shown in FIG. 2) and the first sub-sections 2021 are located on the first metal layer 5. The second sub-sections 2022 are located in the second metal layer 6. The first sub-section 2021 and the second sub-section 2022 may be connected via a via hole 2023 in order to achieve electrical connection between the first sub-section 2021 and the second sub-section 2022. It should be understood that an interlayer insulating layer 7 is further arranged between the first metal layer 5 and second metal layer 6.

Figure 3:
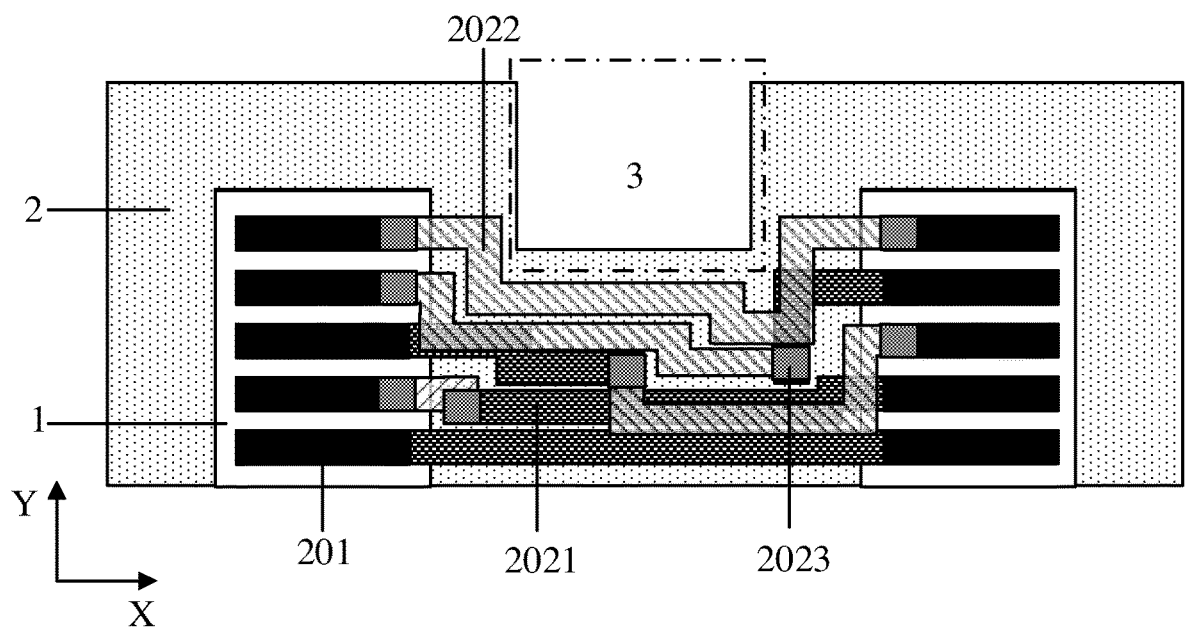
FIG. 3 is a schematic partial structural diagram of an array substrate according to the present disclosure.

FIG. 3 is a schematic partial structural diagram of an array substrate according to the present disclosure. As shown in FIG. 3, an orthographic projection of at least a part of the second sub-section 2022 on the substrate layer 4 (not shown in FIG. 3) at least partially overlaps an orthographic projection of a part of the first sub-section 2021 on the substrate layer 4 (not shown in FIG. 3). Since the first sub-section 2021 and the second sub-section 2022 are located in the different metal layers, the first sub-section 2021 and the second sub-section 2022 are electrically connected through the via hole 2023, and the second sub-section 2022 and the regular section 201 located in the different metal layers are electrically connected to each other via the via hole 2023. The first sub-section 2021 and the second sub-section 2022 located in the different metal layers at least partially overlap each other, such that a wiring density of the non-display region 2 around the notch 3 can be effectively increased and a width of a border around the notch 3 can be reduced so as to achieve a narrow border design of the region. In addition, the gate lines are driven in a time division manner, overlapping first sub-section 2021 and second sub-section 2022 are located in the different gate lines, hence the loading of gate lines are not affected.

Figure 4:
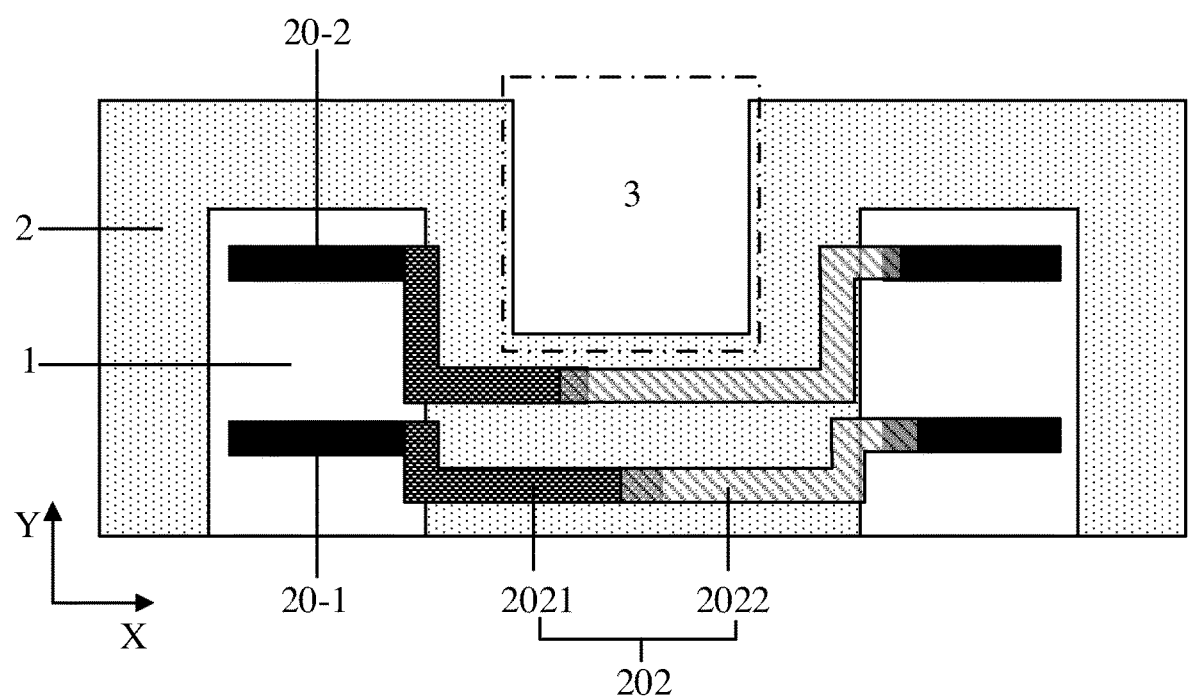
FIG. 4 is a schematic partial structural diagram of another array substrate according to the present disclosure.

FIG. 4 is a schematic partial structural diagram of another array substrate according to the present disclosure. As shown in FIG. 4, the irregular gate lines 20 include a first irregular gate line 20-1 and a second irregular gate line 20-2. A length of an irregular section 202 of the first irregular gate line 20-1 is greater than a length of an irregular section 202 of the second irregular gate lines 20-2. The irregular section 202 includes a first sub-section 2021 and a second sub-section 2022, and a length of the second sub-section 2022 of the first irregular gate line 20-1 is greater than a length of the second sub-section 2022 of the second irregular gate line 20-2. A resistivity of the first sub-section 2021 is greater than a resistivity of the second sub-section 2022, and lengths of the regular sections of the gate lines are substantially the same. Therefore, the irregular gate line 20 with the longer irregular section 202 is longer. In order to ensure that resistances of the irregular gate lines 20 are substantially the same, the irregular gate line 20 with the longer irregular section 202 should have the longer second sub-section 2022.

Different positions of the notch affect the wiring mode of the irregular section of the irregular gate line, and thus affecting the length of the second sub-section. In order to describe a change rule of the lengths of the first sub-section and the second sub-section in the irregular gate lines, three types of array substrates with notches in different positions are described below.

Figure 5:
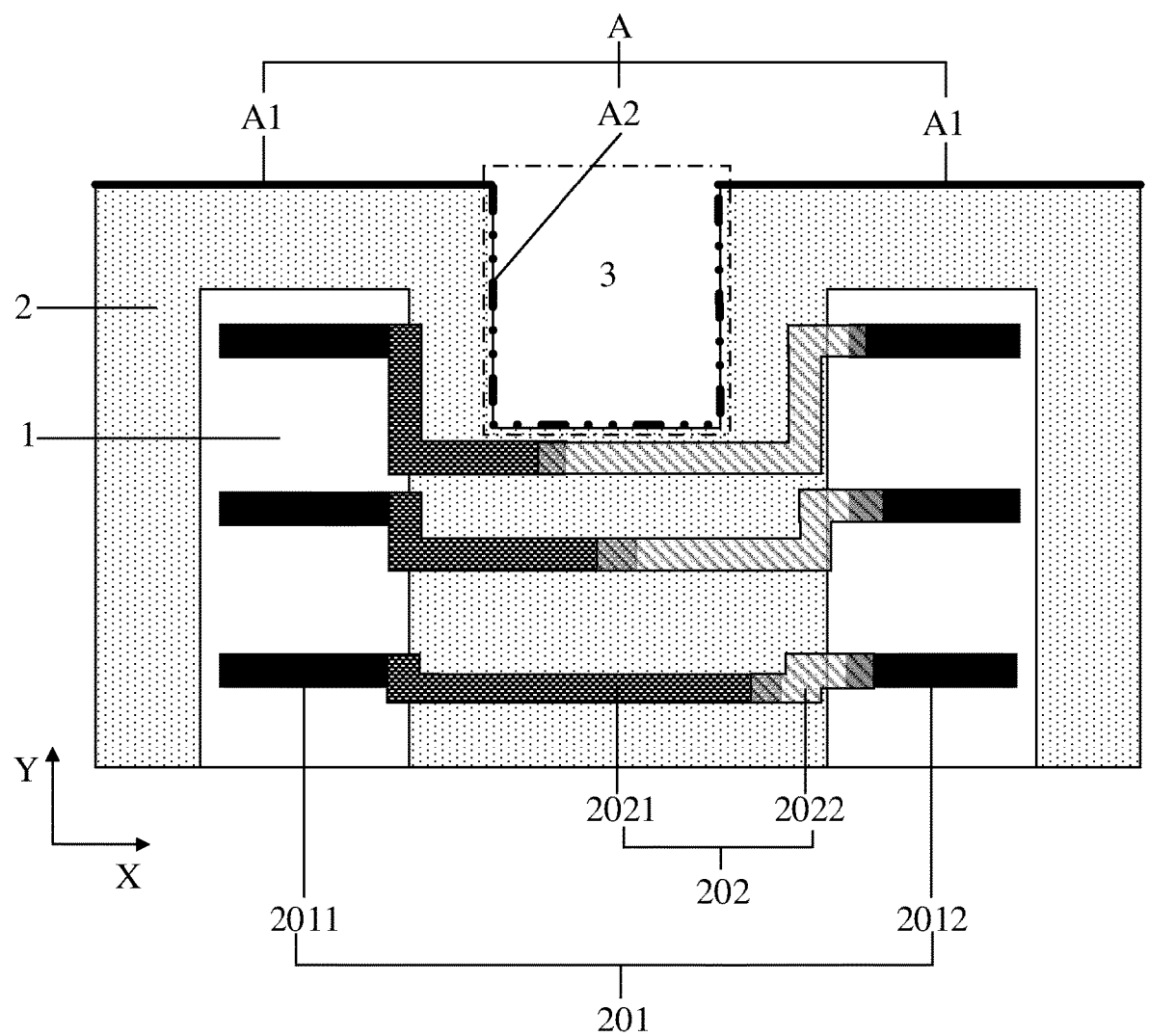
FIG. 5 is a schematic structural diagram of an array substrate with a notch, according to one embodiment of the present disclosure.

FIG. 5 is a schematic structural diagram of an array substrate with a notch located in a first position according to the present disclosure. As shown in FIG. 5, the array substrate includes a first edge A. The first edge A includes a regular edge A1 extended in a first direction X and an irregular edge A2 recessed into the display region, and the irregular edge A2 forms the notch 3. The irregular section 202 includes the first sub-section 2021 and the second sub-section 2022. In a second direction Y from the first edge A to the display region 1, lengths of the first sub-sections 2021 in the irregular gate lines 20 are gradually increased, and lengths of the second sub-sections 2022 are gradually decreased. The second direction Y is perpendicular to the first direction X. In the array substrate shown in FIG. 5, two ends of the irregular edge A2 are connected to the regular edge A1. The regular section 201 includes a first sub-regular section 2011 and a second sub-regular section 2012. In the first direction X, the first sub-regular section 2011 and the second sub-regular section 2012 are respectively located on both sides of the notch 3 in the first direction, and two ends of the irregular section 202 are respectively electrically connected to the first sub-regular section 2011 and the second sub-regular section 2012 of the same irregular gate line.

Figure 6:
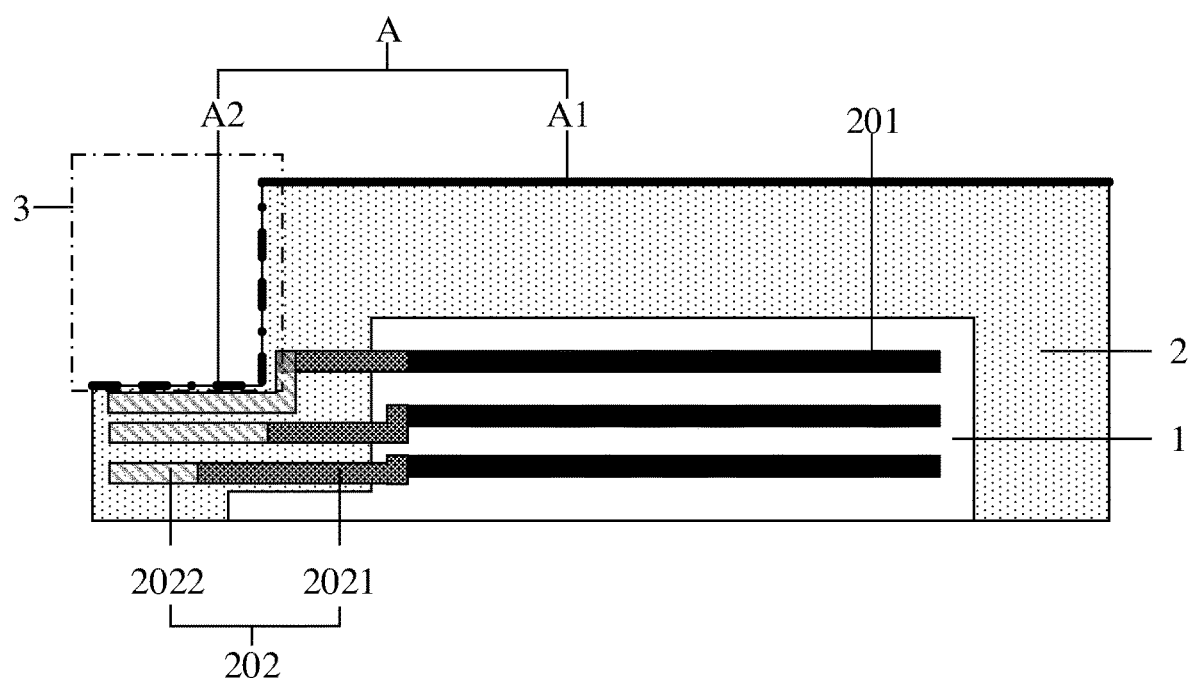
FIG. 6 is a schematic structural diagram of an array substrate with a notch according to one embodiment of the present disclosure.

FIG. 6 is a schematic structural diagram of an array substrate with a notch located in a second position according to the present disclosure. As shown in FIG. 6, the array substrate includes a first edge A. The first edge A includes the regular edge A1 extended in the first direction X and the irregular edge A2 recessed into the display region, and the irregular edge A2 forms the notch 3. The irregular section 202 includes the first sub-section 2021 and the second sub-section 2022. In the second direction Y from the first edge A to the display region 1, the lengths of the first sub-sections 2021 in the irregular gate lines 20 are gradually increased, and the lengths of the second sub-sections 2022 are gradually decreased. The second direction Y is perpendicular to the first direction X. In the array substrate shown in FIG. 6, only one end of the irregular edge A2 is connected to the regular edge A1. Only one end of the regular edge A1 of the array substrate in FIG. 6 is connected to the irregular edge A2. Practically, two ends of the regular edge A1 may be connected to the irregular edge A2. In this case, the array substrate includes two notches.

Figure 7:
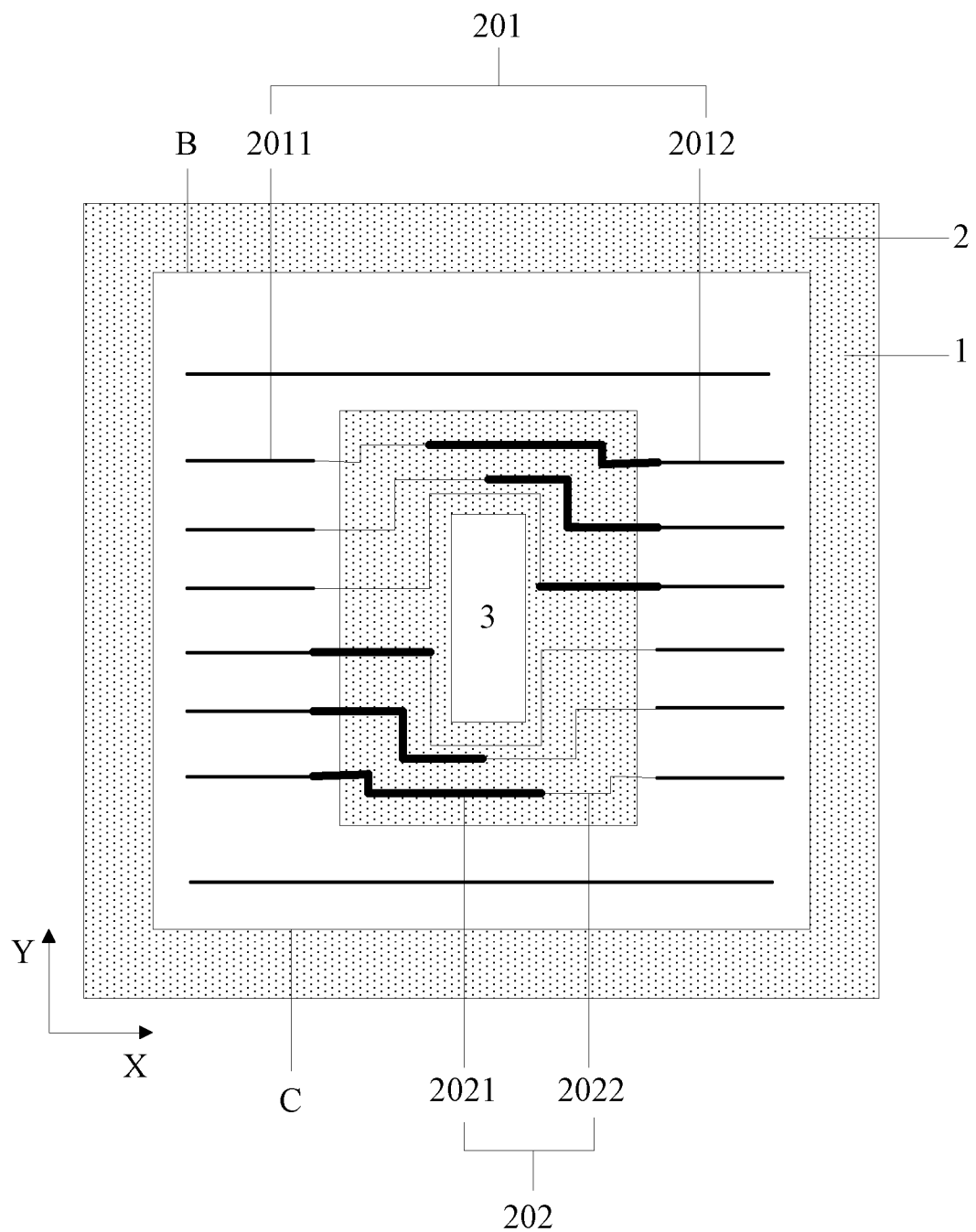
FIG. 7 is a schematic structural diagram of an array substrate with a notch according to one embodiment of the present disclosure.

FIG. 7 is a schematic structural diagram of an array substrate with a notch located in a third position according to the present disclosure. As shown in FIG. 7, a through hole is provided at a geometric center portion of the array substrate to form the notch 3. The display region 1 of the array substrate includes a second edge B and a third edge C in the second direction Y which are located at both sides of the notch, and the second direction Y is perpendicular to the first direction X. The regular section 201 includes the first sub-regular section 2011 and the second sub-regular section 2012. In the first direction X, the first sub-regular section 2011 and the second sub-regular section 2012 are located at both sides of the notch 3 in the first direction, and two ends of the irregular section 202 are respectively electrically connected to the first sub-regular section 2011 and the second sub-regular section 2012 of the same irregular gate line. The irregular section 202 includes the first sub-section 2021 and the second sub-section 2022. For the irregular sections 202 located between the second edge B and the notch 3, in the second direction Y from the second edge B to the notch 3, lengths of the first sub-sections 2021 of the irregular sections 202 are gradually decreased, and lengths of the second sub-sections 2022 of the irregular sections 202 are gradually increased. For the irregular sections 202 located between the third edge C and the notch 3, in the second direction Y from the third edge C to the notch 3, lengths of the first sub-sections 2021 of the irregular sections 202 are gradually decreased, and lengths of the second sub-sections 2022 of the irregular sections 202 are gradually increased. The irregular sections 202 shown in FIG. 7 are relatively evenly arranged on both sides of the notch 3 in the second direction Y. Practically, the irregular sections may be located on one side of the notch 3 in the second direction, which does not affect the implementation of the present disclosure. Compared with a solution that the irregular sections 202 are located on one side of the notch 3 in the second direction Y, a solution that the irregular sections 202 are evenly arranged on both sides of the notch 3 in the second direction Y, is more beneficial to reduce the length of some irregular sections 202 and more beneficial to the narrow border design around the notch 3.

It may be known from the array substrates in FIGS. 5 to 7 that, no matter the notch 3 is located on the edge of the array substrate (the array substrates shown in FIGS. 5 and 6), or located at the geometric center portion of the array substrate, the longer irregular gate line has the longer second sub-section 2022. By such arrangement mode, it can be ensured that the resistances of the irregular gate lines are substantially the same. It should be noted that the resistance of the irregular gate lines should be substantially the same as the resistance of the regular gate lines, which is beneficial to improve the display effect.

The array substrate has different gate drive modes. The commonly used gate drive mode includes unilateral drive, bilateral drive and alternating drive. In order to simplify the description, the array substrate with the notch located at the position shown in FIG. 5 is taken as an example in the embodiment. It should be understood that no matter where the notch is located on the array substrate, the gate drive mode is not affected.

Figure 8:
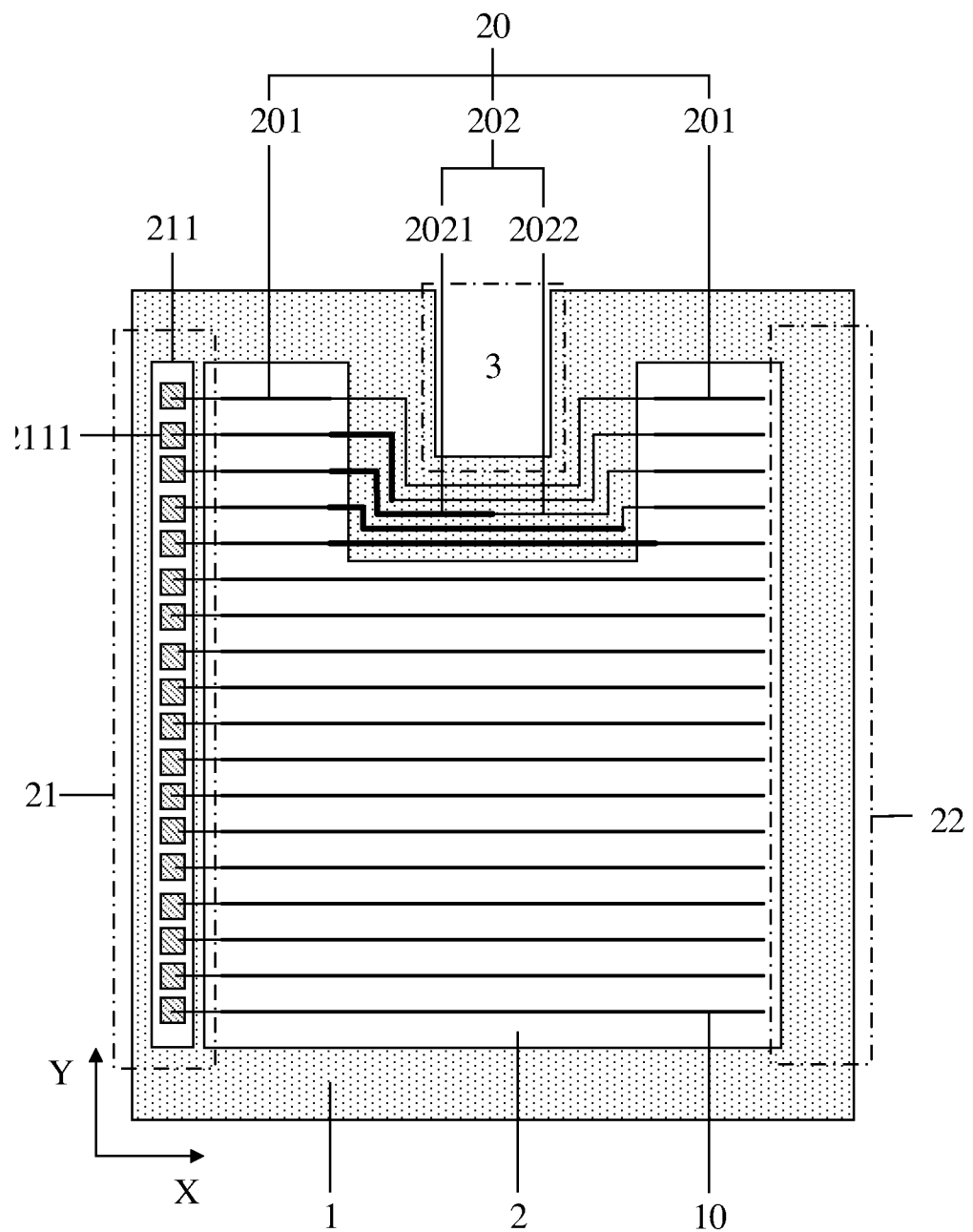
FIG. 8 shows an array substrate in which a gate is driven unilaterally according to one embodiment of the present disclosure.

FIG. 8 shows an array substrate in which a gate is driven unilaterally according to the present disclosure. As shown in FIG. 8, in the array substrate, in the first direction X, the non-display region 2 includes a first non-display region 21 and a second non-display region 22 located at two opposite sides of the display region 1. Only the first non-display region 21 is provided with a first shift register group 211. The first shift register group 211 includes multiple cascaded first shift registers 2111, and the gate lines are electrically connected to the first shift registers 2111. Practically, only the second non-display region may be provided with a second shift register group. The second shift register group includes multiple cascaded second shift registers, and the gate lines are electrically connected to the second shift registers, which is not limited in the embodiment.

Figure 9:
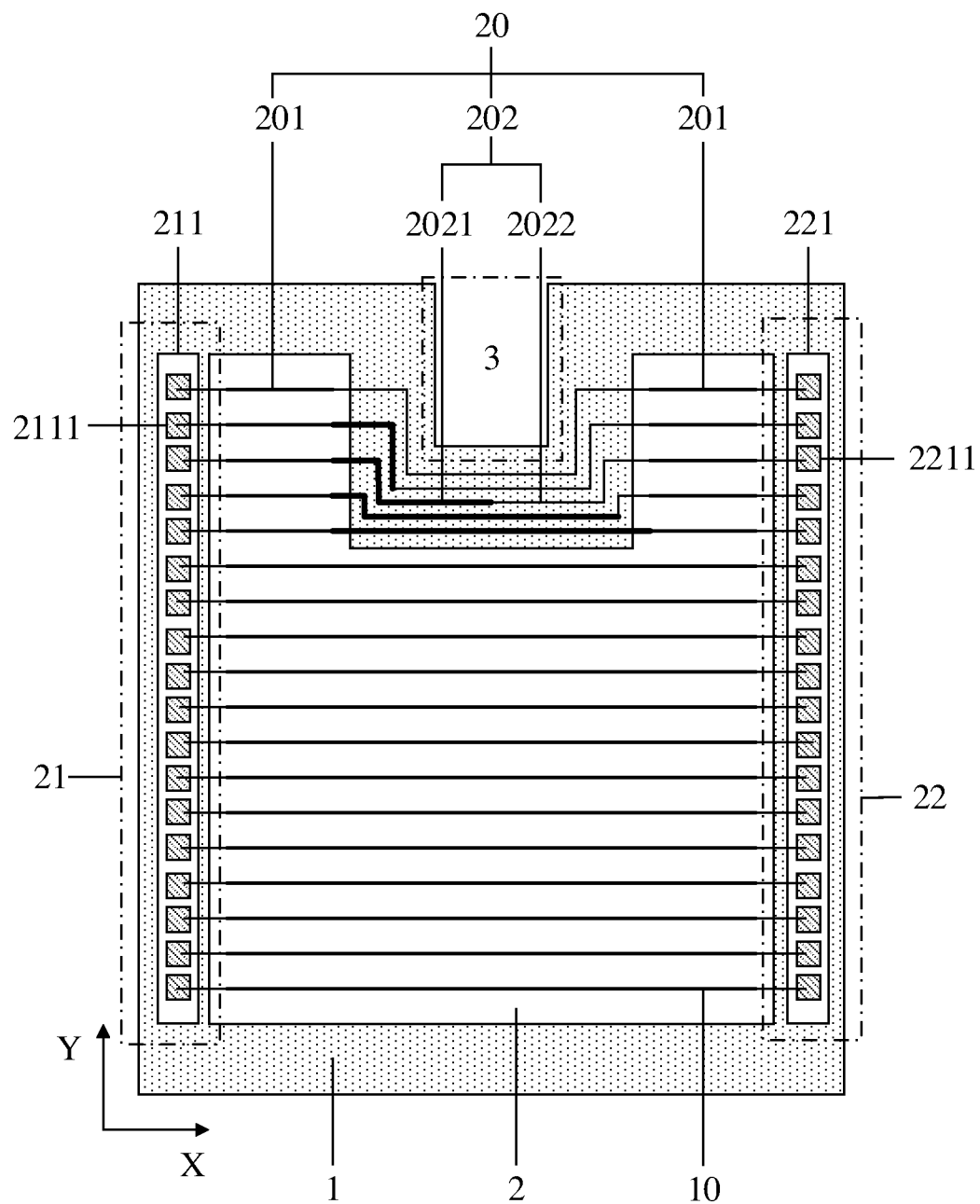
FIG. 9 shows an array substrate in which a gate is driven bilaterally according to one embodiment of the present disclosure.

FIG. 9 shows an array substrate in which a gate is driven bilaterally according to the present disclosure. As shown in FIG. 9, in the array substrate, in the first direction X, the non-display region 2 includes the first non-display region 21 and the second non-display region 22 located at two opposite sides of the display region 1. The first non-display region 21 is provided with the first shift register group 211, and the second non-display region 22 is provided with the second shift register group 221. The first shift register group 211 includes multiple cascaded first shift registers 2111, and the second shift register group 221 includes multiple cascaded second shift registers 2211. Two ends of the gate line are respectively electrically connected to the first shift register 2111 and the second shift register 2211.

Figure 10:
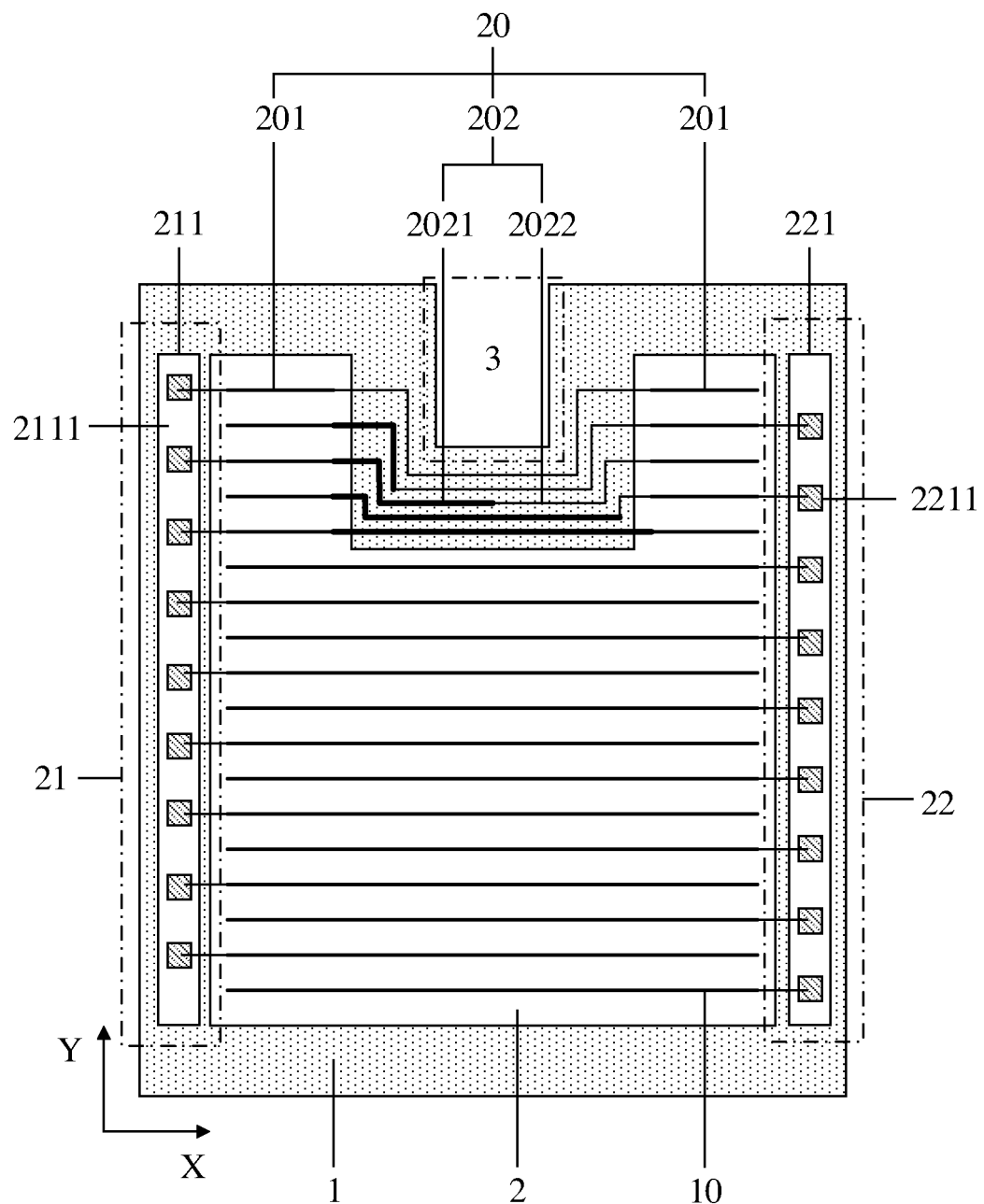
FIG. 10 shows an array substrate in which a gate is driven in an alternating manner according to one embodiment of the present disclosure.

FIG. 10 shows an array substrate in which a gate is driven in an alternating manner according to the present disclosure. As shown in FIG. 10, in the array substrate, in the first direction X, the non-display region 2 includes the first non-display region 21 and the second non-display region 22 located at two opposite sides of the display region 1. The first non-display region 21 is provided with the first shift register group 211, and the second non-display region 22 is provided with the second shift register group 221. The first shift register group 211 includes multiple cascaded first shift registers 2111, and the second shift register group 221 includes multiple cascaded second shift registers 2211. In the second direction Y, the gate lines are alternately connected to the first shift registers 2111 and the second shift registers 2211. The second direction Y is perpendicular to the first direction X.

It may be known from FIGS. 8 to 10 that, the array substrate provided in the present disclosure may be an array substrate in which a gate is driven unilaterally, bilaterally or alternately. The gate drive mode adopted by the array substrate is determined based on the actual requirements.

Figure 11:
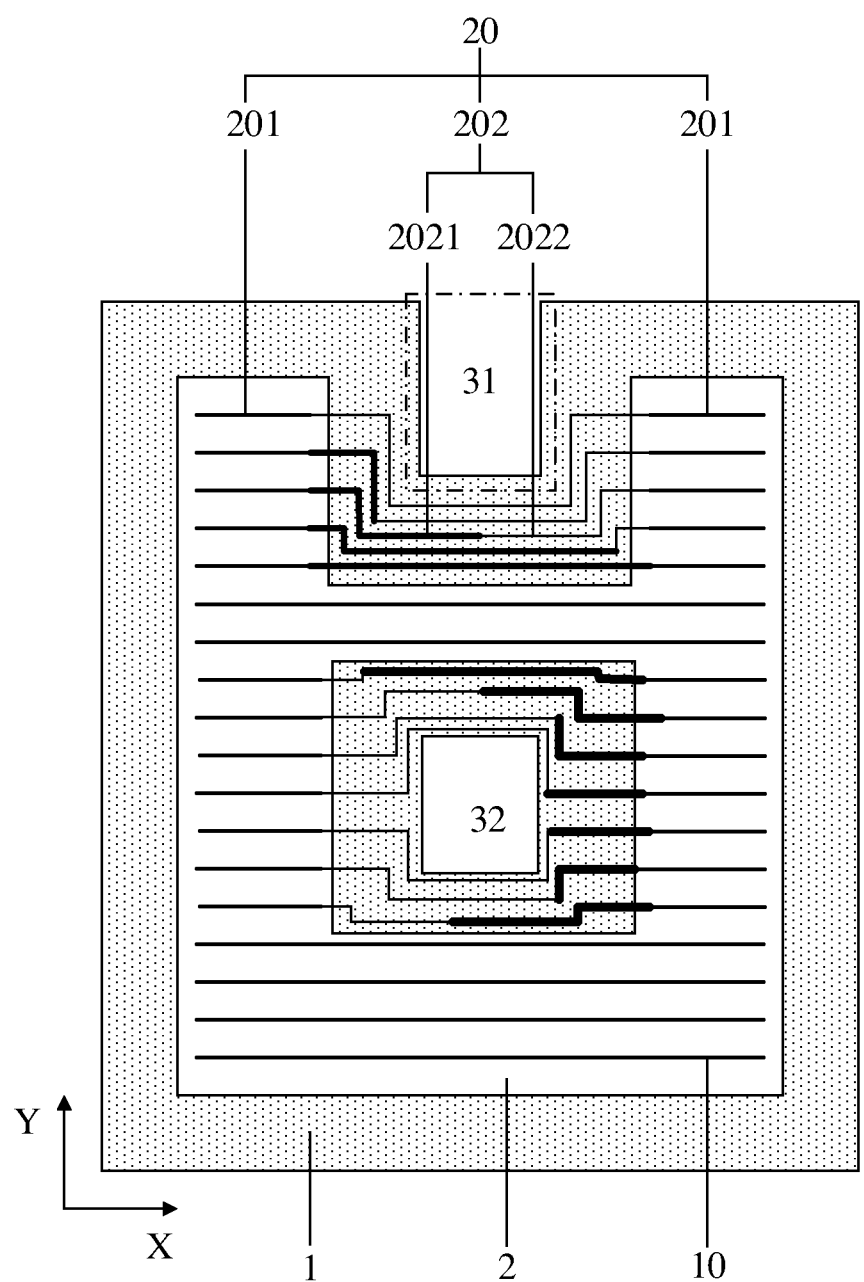
FIG. 11 is a schematic structural diagram of another array substrate according to one embodiment of the present disclosure.

It should be noted that the number of the notches of the array substrate provided in the present disclosure is not limited to be one, and the same array substrate may have multiple notches. FIG. 11 is a schematic structural diagram of another array substrate according to the present disclosure. As shown in FIG. 11, the same array substrate may include a notch 31 located on an edge of the array substrate and a notch 32 located at a geometric center portion of the array substrate. The notch 31 located on the edge of the array substrate in FIG. 11 is located in the middle of the array substrate edge. Practically, the notch 31 may be located on an end of the array substrate edge, which does not affect the implementation of the present disclosure.

Although shapes of the notches in the drawings of the present disclosure are all rectangles, the rectangle is only illustrative and is not used for limiting the shape of the notch. Optionally, the shapes of the notches include but are not limited to rectangles, trapezoids, or triangles. The shapes of the notches may be determined based on actual design requirements, and does not affect implementation of the present disclosure.

Figure 12:
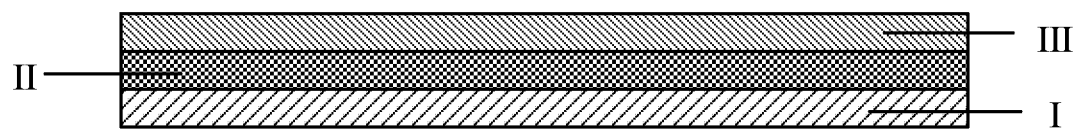
FIG. 12 is a schematic cross sectional diagram of a display panel according to the present disclosure.

In order to solve the above problem, a display panel is further provided in the embodiment. The display panel includes any one of the array substrates in the above embodiments. The regular sections located on both sides of the notch are connected via the irregular section to form the irregular gate lines, such that the gate lines near the notch can be driven. In addition, the irregular section includes the first sub-section and the second sub-section, and the resistivity of the first sub-section is greater than the resistivity of the second sub-section. In this way, it is ensured that the resistance of the irregular gate lines is substantially the same as the resistance of the regular gate lines, thereby improving the display effect of the display panel. FIG. 12 is a schematic cross sectional diagram of a display panel according to the present disclosure. As shown in FIG. 12, a side of an array substrate I is provided with a pixel definition layer II, and a side of the pixel definition layer II facing away from the array substrate I is provided with a packaging layer III. The display panel provided in the present disclosure may be a liquid crystal display panel or an organic light emitting display panel. In addition, the display panel provided in the present disclosure may further include a touch function, which is not limited herein.

Compared with the conventional technology, the array substrate and the display panel provided in the present disclosure achieve following beneficial effects:

An array substrate and a display panel are provided in the present disclosure. The regular sections located on both sides of the notch are connected via the irregular section to form the irregular gate lines, such that the gate lines near the notch can be driven. In addition, the irregular section includes the first sub-section and the second sub-section, and the resistivity of the first sub-section is greater than the resistivity of the second sub-section. In this way, it is ensured that the resistance of the irregular gate lines is substantially the same as the resistance of the regular gate lines, thereby improving the display effect of the display panel.

Although some specific embodiments of the present disclosure are described by examples in detail, those skilled in the art should understand that the above examples are only for illustration, rather than limiting the scope of the present disclosure. Those skilled in the art should understand that the above embodiments may be modified without deviating from the scope and spirit of the present disclosure. The scope of the disclosure is defined by the appended claims.

What is claimed is:

1. An array substrate, comprising:
   a substrate layer;
   a display region;
   a non-display region surrounding the display region;
   at least one notch in the non-display region;
   a plurality of gate lines,
   a first metal layer; and
   a second metal layer;
   wherein the plurality of gate lines comprises regular gate lines and irregular gate lines, wherein each of the regular gate lines is located in the display region and extends in a first direction; wherein each of the irregular gate lines comprises a regular section located in the display region and extends in the first direction and an irregular section located in the non-display region around the notch, wherein the regular section and the irregular section of the same irregular gate line are electrically connected to each other;
   wherein the irregular section comprises at least one of a first sub-section and a second sub-section, wherein the first sub-section and the second sub-section of the same irregular section are electrically connected to each other, and a resistivity of the first sub-section is greater than a resistivity of the second sub-section;
   wherein the first metal layer is located at a surface of the substrate layer, the second metal layer is located over a surface of the first metal layer facing away from the substrate layer; and
   wherein the regular gate lines, the regular section in each of the irregular gate lines and the first sub-section of each of the irregular sections, are located in the first metal layer, and the second sub-section of each of the irregular sections are located in the second metal layer.

2. The array substrate according to claim 1, wherein an orthographic projection of a part of the second sub-section on the substrate layer partially overlaps an orthographic projection of a part of the first sub-section on the substrate layer.

3. The array substrate according to claim 1, wherein the irregular gate lines comprise first irregular gate lines and second irregular gate lines, a length of an irregular section of the first irregular gate line is greater than a length of an irregular section of the second irregular gate line; the irregular section comprises a first sub-section and a second sub-section, and a length of the second sub-section of the first irregular gate line is greater than a length of the second sub-section of the second irregular gate line.

4. The array substrate according to claim 3, comprising a first edge, wherein
the first edge comprises a regular edge extended in a first direction and an irregular edge recessed into the display region, and the irregular edge forms the notch; and
the irregular section comprises the first sub-section and the second sub-section; in a second direction from the first edge to the display region, lengths of the first sub-sections of the irregular gate lines are gradually increased, and lengths of the second sub-sections of the irregular gate lines are gradually decreased, wherein the second direction is perpendicular to the first direction.

5. The array substrate according to claim 4, wherein only one end of the irregular edge is connected to the regular edge.

6. The array substrate according to claim 4, wherein two ends of the irregular edge are connected to the regular edge; and
wherein the regular section comprises a first sub-regular section and a second sub-regular section; in the first direction, the first sub-regular section and the second sub-regular section are respectively located on both sides of the notch in the first direction, and two ends of the irregular section are electrically connected to the first sub-regular section and the second sub-regular section of the same irregular gate line.

7. The array substrate according to claim 3,
wherein a through hole is arranged at a geometric center portion of the array substrate to form the notch;
wherein the display region of the array substrate comprises a second edge and a third edge in a second direction which are located at both sides of the notch, and the second direction is perpendicular to the first direction;
wherein the regular section comprises a first sub-regular section and a second sub-regular section; in the first direction, the first sub-regular section and the second sub-regular section are respectively located at both sides of the notch in the first direction, and two ends of the irregular section are electrically connected to the first sub-regular section and the second sub-regular section of the same irregular gate line;
wherein the irregular section is located at least one of a position between the second edge and the notch and a position between the third edge and the notch;
wherein the irregular section comprises a first sub-section and a second sub-section; for the irregular section located between the second edge and the notch, in a second direction from the second edge to the notch, lengths of the first sub-sections of the irregular sections are gradually decreased, and lengths of the second sub-sections in the irregular sections are gradually increased; and
for the irregular section located between the third edge and the notch, in the second direction from the third edge to the notch, lengths of the first sub-sections of the irregular sections are gradually decreased, and lengths of the second sub-sections of the irregular sections are gradually increased.

8. The array substrate according to claim 1, wherein
in the first direction, the non-display region comprises a first non-display region and a second non-display region located at two opposite sides of the display region;
the first non-display region is provided with a first shift register group, the second non-display region is provided with a second shift register group; the first shift register group comprises a plurality of cascaded first shift registers, and the second shift register group comprises a plurality of cascaded second shift registers; and
in the second direction, the gate lines are alternately electrically connected to the first shift registers and the second shift registers, wherein the second direction is perpendicular to the first direction.

9. The array substrate according to claim 1, wherein
in the first direction, the non-display region comprises a first non-display region and a second non-display region located at two opposite sides of the display region;
the first non-display region is provided with a first shift register group, the second non-display region is provided with a second shift register group; the first shift register group comprises a plurality of cascaded first shift registers, and the second shift register group comprises a plurality of cascaded second shift registers; and
two ends of each of the gate lines are electrically connected to the first shift register and the second shift register respectively.

10. The array substrate according to claim 1, wherein
in the first direction, the non-display region comprises a first non-display region and a second non-display region located at two opposite sides of the display region; and
only the first non-display region is provided with a first shift register group, the first shift register group comprises a plurality of cascaded first shift registers, and the gate lines are electrically connected to the first shift registers; or
only the second non-display region is provided with a second shift register group, the second shift register group comprises a plurality of cascaded second shift registers, and the gate lines are electrically connected to the second shift registers.

11. The array substrate according to claim 1, wherein the notch is rectangular, a trapezoidal, or triangular.

12. A display panel, comprising an array substrate, wherein the array substrate comprises:
a substrate layer;
a display region;
a non-display region surrounding the display region;
at least one notch in the non-display region;
a plurality of gate lines, a first metal layer; and
a second metal layer;
wherein the plurality of gate lines comprises regular gate lines and irregular gate lines, wherein each of the regular gate lines is located in the display region and extends in a first direction; wherein each of the irregular gate lines comprises a regular section located in the display region and extends in the first direction and an irregular section located in the non-display region around the notch, wherein the regular section and the irregular section of the same irregular gate line are electrically connected to each other;
wherein the irregular section comprises at least one of a first sub-section and a second sub-section, wherein the first sub-section and the second sub-section of the same irregular section are electrically connected to each other, and a resistivity of the first sub-section is greater than a resistivity of the second sub-section;

wherein the first metal layer is located at a surface of the substrate layer, the second metal layer is located over a surface of the first metal layer facing away from the substrate layer; and wherein the regular gate lines, the regular section in each of the irregular gate lines and the first sub-section of each of the irregular sections, are located in the first metal layer, and the second sub-section of each of the irregular sections are located in second metal layer.

* * * * *